(12) United States Patent
Adkisson et al.

(10) Patent No.: US 9,425,269 B1
(45) Date of Patent: Aug. 23, 2016

(54) REPLACEMENT EMITTER FOR REDUCED CONTACT RESISTANCE

(71) Applicant: GLOBALFOUNDRIES INC., Grand Cayman (KY)

(72) Inventors: James W. Adkisson, Jericho, VT (US); Jeffrey P. Gambino, Portland, OR (US); Anthony K. Stamper, Williston, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/747,604

(22) Filed: Jun. 23, 2015

(51) Int. Cl.
*H01L 21/768* (2006.01)
*H01L 29/417* (2006.01)
*H01L 29/40* (2006.01)

(52) U.S. Cl.
CPC ... *H01L 29/41708* (2013.01); *H01L 21/76802* (2013.01); *H01L 21/76829* (2013.01); *H01L 29/401* (2013.01)

(58) Field of Classification Search
CPC .............. H01L 21/76877; H01L 29/0804; H01L 29/66272; H01L 29/732
USPC .................. 257/587, 588; 438/343
See application file for complete search history.

(56) References Cited

U.S. PATENT DOCUMENTS

| | | | |
|---|---|---|---|
| 6,492,238 B1 | 12/2002 | Ahlgren et al. | |
| 6,686,250 B1 | 2/2004 | Kalnitsky et al. | |
| 6,869,853 B1 | 3/2005 | Gopalan | |
| 7,453,151 B2 | 11/2008 | Feilchenfeld et al. | |
| 7,466,010 B2 * | 12/2008 | Ahlgren | H01L 29/0804 257/584 |
| 7,687,887 B1 | 3/2010 | El-Diwany et al. | |
| 7,701,015 B2 | 4/2010 | He et al. | |
| 7,838,375 B1 | 11/2010 | Xu et al. | |
| 8,524,551 B2 | 9/2013 | Meunier-Beillard et al. | |
| 8,552,532 B2 | 10/2013 | Clark, Jr. et al. | |
| 2005/0037587 A1 | 2/2005 | Martinet et al. | |
| 2011/0248382 A1 | 10/2011 | Pellizzer et al. | |
| 2012/0001192 A1 | 1/2012 | Fox et al. | |
| 2013/0119516 A1 | 5/2013 | Harame et al. | |

OTHER PUBLICATIONS

Candra, Jain, Cheng, Pekarik, Camillo-Castillo, Gray, Kessler, Gambino, Dunn and Harame, "A 130nm SiGe BiCMOS technology for mm-wave applications featuring HBT with fT/fMAX of 260/320 GHz," 2013 IEEE Radio Frequency Integrated Circuits Symposium, pp. 381-384.

* cited by examiner

*Primary Examiner* — Mark Prenty
(74) *Attorney, Agent, or Firm* — Thompson Hine LLP; Anthony Canale

(57) ABSTRACT

Device structures for a bipolar junction transistor and methods for fabricating such device structures. An emitter structure is formed that has a semiconductor layer with a top surface defining a recess and a sacrificial layer comprised of a disposable material in the recess. A contact opening is formed that extends through one or more first dielectric layers to the sacrificial layer. After the contact opening is formed, the sacrificial layer is removed from the recess. Alternatively, the layer in the recess may be comprised of a non-disposable material that may occupy the recess at the time that a contact is formed in the contact opening.

16 Claims, 13 Drawing Sheets

100
REPLACEMENT EMITTER FOR REDUCED CONTACT RESISTANCE

BACKGROUND

The invention relates generally to integrated circuit fabrication and semiconductor devices and, in particular, to device structures for a bipolar junction transistor and methods for fabricating a device structure for a bipolar junction transistor.

Bipolar junction transistors may be found, among other end uses, in high-frequency and high-power applications. In particular, bipolar junction transistors may find specific end uses in amplifiers for wireless communications systems and mobile devices, switches, and oscillators. Bipolar junction transistors may also be used in high-speed logic circuits. Bipolar junction transistors are three-terminal electronic devices that include an emitter, an intrinsic base, and a collector defined by regions of different semiconductor materials. In the device structure, the intrinsic base situated between the emitter and collector. An NPN bipolar junction transistor may include n-type semiconductor material regions constituting the emitter and collector, and a region of p-type semiconductor material constituting the intrinsic base. A PNP bipolar junction transistor includes p-type semiconductor material regions constituting the emitter and collector, and a region of n-type semiconductor material constituting the intrinsic base. In operation, the base-emitter junction is forward biased and the base-collector junction is reverse biased. The collector-emitter current may be controlled by the base-emitter voltage.

Improved device structures for a bipolar junction transistor and methods for fabricating a device structure for a bipolar junction transistor are needed.

SUMMARY

In an embodiment of the invention, a method is provided for fabricating a device structure. An emitter structure is formed that has a semiconductor layer with a top surface defining a recess and a sacrificial layer comprised of a disposable material in the recess. A contact opening is formed that extends through one or more first dielectric layers to the sacrificial layer. After the contact opening is formed, the sacrificial layer is removed from the recess.

In an embodiment of the invention, a method is provided for fabricating a device structure. An emitter structure is formed that has a semiconductor layer with a top surface defining a recess and a sacrificial layer comprised of a disposable material in the recess. A contact opening is formed that extends through one or more first dielectric layers to the semiconductor layer and the conductor layer. After the contact opening is formed, forming a contact in the contact opening to contact the semiconductor layer and the conductor layer.

In another embodiment, a device structure is provided that includes an emitter including comprised of a semiconductor layer with a top surface defining a recess. The device structure further includes one or more first dielectric layers overlying the top surface of the emitter and a contact opening extending through the one or more first dielectric layers to the recess. A contact in the contact opening, and a portion of the contact is received in the recess.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
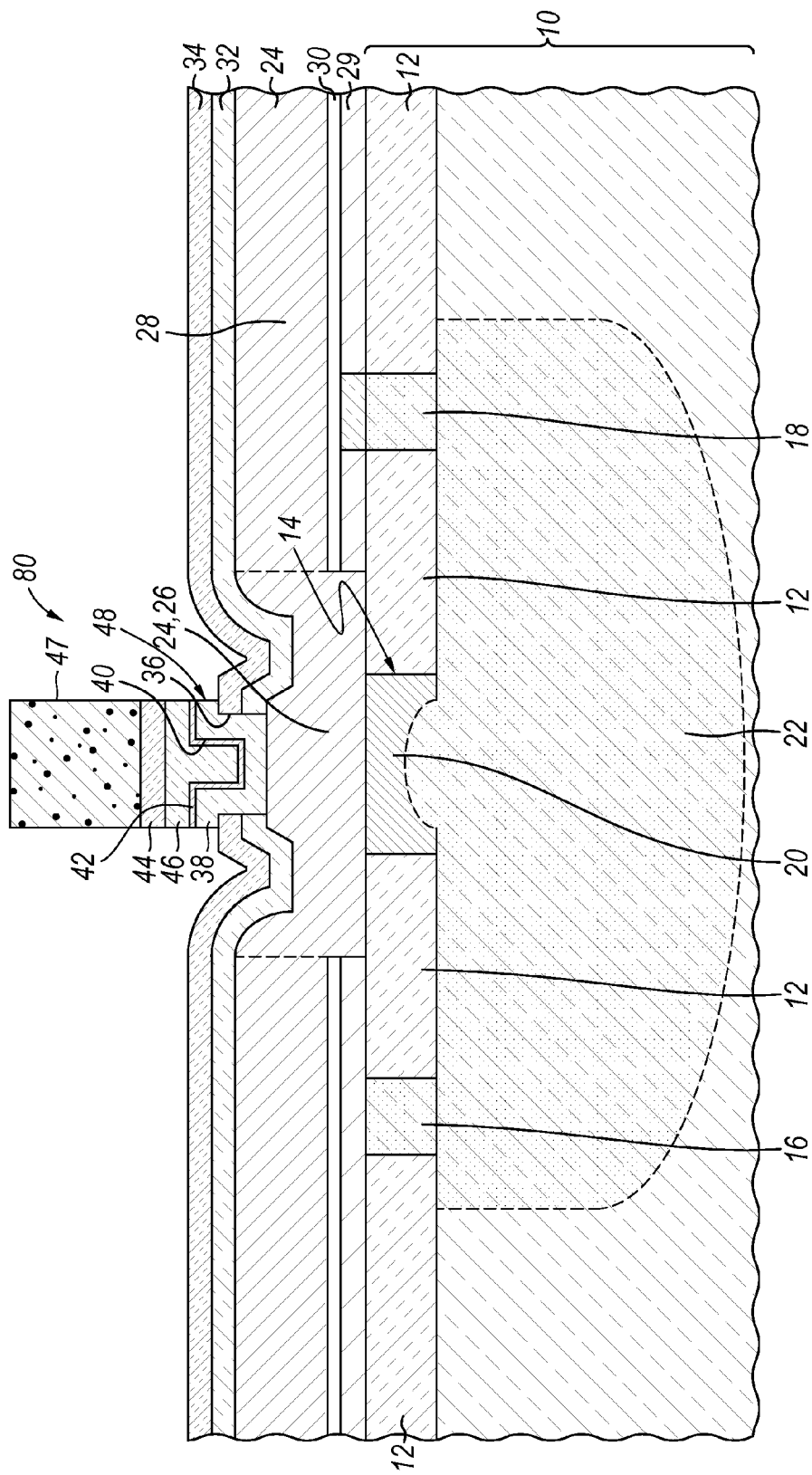
FIGS. 1-7 are cross-sectional views of a portion of a substrate at successive fabrication stages of a processing method for fabricating a device structure in accordance with an embodiment of the invention.

With reference to FIG. 1 and in accordance with an embodiment of the invention, a substrate 10 comprises a single-crystal semiconductor material suitable for the fabrication of the device structures of an integrated circuit. The semiconductor material constituting the substrate 10 may include an epitaxial layer at its top surface, and the epitaxial layer may be doped with an electrically-active dopant to alter its electrical conductivity. For example, an epitaxial layer of single crystal silicon may be epitaxially deposited or grown on the substrate 10 by chemical vapor deposition (CVD) and doped with an n-type dopant from Group V of the Periodic Table (e.g., phosphorus (P) or arsenic (As)) in a concentration effective to impart n-type conductivity.

Trench isolation regions 12 are positioned in the semiconductor material of the substrate 10. The trench isolation regions 12 define the bounds of, and furnish electrical isolation for, a device region 14 and collector contact regions 16, 18, which are each comprised of portions of the semiconductor material of the substrate 10. The collector contact regions 16, 18 are positioned adjacent to the device region 14 and are separated from the device region 14 by the trench isolation regions 12.

The trench isolation regions 12 may be formed by a shallow trench isolation (STI) technique. To that end, a mask layer may be applied to a top surface of the substrate 10. The mask layer may comprise, for example, a photoresist that is applied with a spin coating process, pre-baked, exposed to a radiation projected through a photomask, baked after exposure, and developed with a chemical developer to define a pattern with openings coinciding with the intended positions of trenches for the trench isolation regions 12. One or more etching processes may be used to define the trenches in the substrate 10 at positions consistent with the pattern of openings. Each etching process may comprise a wet chemical etch or a dry etch, and may rely on a given etch chemistry. The trenches, which extend to a given depth into the substrate 10, may be filled with an electrical insulator by depositing a layer of the electrical insulator to fill the trenches and then planarizing with, for example, chemical mechanical polishing (CMP) to remove excess material of the electrical insulator layer from the top surface of substrate 10. The trench isolation regions 12 may be comprised of a dielectric material, such as an oxide of silicon (e.g., silicon dioxide ($SiO_2$)) deposited by chemical vapor deposition.

The device region 14 may include a collector 20 for a bipolar junction transistor. The collector 20 may constitute all or a portion of the device region 14. The electrical conductivity of the collector 20 may be elevated relative to the substrate 10 by, for example, an ion implantation of an electrically-active dopant. A subcollector 22 may extend laterally in the substrate 10 beneath the trench isolation regions 12 in order to couple the collector 20 with the collector contact regions 16, 18.

A base layer 24 of the bipolar junction transistor is located on a top surface of the device region 14. The base layer 24 may include a section 26, which may be single crystal, positioned in vertical alignment with the device region 14 and that directly contacts the single crystal semiconductor material of the device region 14. Section 26 of the base layer 24 is formed in an opening defined in layers 29, 30, which are provided by processing occurring on the substrate 10. The base layer 24 may further include a field section 28 that overlies the layers 29, 30.

The base layer 24 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the base layer 24 may be uniform or may be graded and/or stepped across the thickness of base layer 24. If the germanium content is stepped, a partial thickness of the base layer 24, such as a partial thickness directly contacting the device region 14, may lack germanium and may instead be entirely comprised of silicon) to provide a thin intrinsic layer between the device region 14 and the base layer 24. The base layer 24 may be doped with a concentration of a dopant, such as a p-type dopant from Group III of the Periodic Table (e.g., boron or phosphorus) effective to impart p-type conductivity.

The base layer 24 may be formed using a low temperature epitaxial (LTE) growth process, such as vapor phase epitaxy (VPE) conducted at a growth temperature ranging from 400° C. to 850° C. Single crystal semiconductor material (e.g., single crystal silicon and/or single crystal SiGe) epitaxially grows in the section 26, which is disposed on the device region 14. The crystal structure of the single crystal semiconductor material of the device region 14 serves as a crystalline template for the growth of the crystal structure of the section 26 of the base layer 24. The field section 28 of the base layer 24 may comprise a mixture of polycrystalline and single crystal semiconductor material. The base layer 24 may be divided into an intrinsic base that participates in the emitter-base junction and an extrinsic base that is either formed on the layer defining the base layer 24 as a raised structure or formed in a portion of the layer defining the base layer 24.

Dielectric layers 32, 34 are located on a top surface of the base layer 24. The dielectric layers 32, 34 may be comprised of different electrical insulators or dielectric materials. In one embodiment, dielectric layer 32 may be comprised of silicon dioxide and dielectric layer 34 may be comprised of silicon nitride ($Si_3N_4$). The dielectric layers 32, 34 may be serially formed by chemical vapor deposition, wet or dry thermal oxidation, or a combination of these processes, and are selected to etch selective to the semiconductor material constituting the base layer 24. The dielectric layers 32, 34 are patterned using photolithography and etching processes to define an emitter opening 36, which is aligned with the section 26 of the base layer 24 and which extends to the top surface of section 26.

An emitter layer 38 is located on the dielectric layer 34 such that a portion of the emitter layer 38 is positioned inside the emitter opening 36 and another portion is positioned on a top surface of the dielectric layer 34 adjacent to the emitter opening 36. The portion of the emitter layer 38 located inside the emitter opening 36 contacts the base layer 24. The emitter layer 38 includes a top surface 40 that extends inside the emitter opening 36 and that is opposite to a surface that is in physical and electrical contact with the base layer 24. The top surface 40 borders a recess that is narrower than the emitter opening 36 and that arises from the partial filling of the emitter opening 36 by the emitter layer 38. The layer thickness of the emitter layer 38, at least in part, determines the dimensions of the recess surrounded by the top surface 40. In an embodiment, the thickness of the emitter layer 38 may be less than one-half of the width of the emitter opening 36, which contributes to forming the recess.

The emitter layer 38 may be comprised of a semiconductor material that is deposited and then patterned using lithography and etching processes. For example, the emitter layer 38 may be comprised of polysilicon or polycrystalline silicon-germanium deposited by chemical vapor deposition or low-pressure chemical vapor deposition (LPCVD) and heavily doped with a concentration of a dopant, such as an n-type dopant from Group V of the Periodic Table (e.g., phosphorus (P) or arsenic (As)), effective to impart n-type conductivity.

A dielectric layer 42 comprised of an electrical insulator is located on the top surface 40 of the emitter layer 38. A sacrificial layer 46 comprised of a disposable material is located on a top surface of the dielectric layer 42. A cap layer 44 is located on a top surface of the sacrificial layer 46. A portion of the disposable material of the sacrificial layer 46 fills the space inside the recess bounded by top surface 40.

The dielectric layer 42 and cap layer 44 may be comprised of different electrical insulators or dielectric materials. In one embodiment, dielectric layer 42 may be comprised of silicon dioxide, and cap layer 44 may be comprised of silicon nitride. The dielectric layer 42 and cap layer 44 may be formed by wet or dry thermal oxidation, chemical vapor deposition, or a combination of these processes, and are selected to etch selective to (i.e., at a higher etch rate than) the semiconductor material constituting the emitter layer 38.

The sacrificial layer 46 may be comprised of a semiconductor material serving as the disposable material. In particular, the semiconductor material comprising the sacrificial layer 46 may be comprised of polycrystalline silicon or polycrystalline silicon-germanium deposited by chemical vapor deposition. The sacrificial layer 46 is sacrificial in a sense that the sacrificial layer 46 is not present in the completed device structure for the bipolar junction transistor and can be removed selective to dielectric layer 42 in a subsequent processing stage of the fabrication method. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The dielectric layer 42 functions as an etch stop to prevent the etching process from reaching the emitter layer 38 inside the emitter opening.

The layers 42, 44, 46 and emitter layer 38 in the layer stack are patterned using photolithography and etching processes to remove respective field regions. The dielectric material of cap layer 44 defines an etch mask on a portion of the disposable material of the sacrificial layer 46. To provide the patterning, a mask layer 47 may be applied on a top surface of the cap layer 44 and patterned with photolithography. The mask layer 47 may be comprised of a light-sensitive material, such as a photoresist, that is applied by a spin coating process, pre-baked, exposed to light projected through a photomask, baked after exposure, and developed with a chemical developer to define an etch mask. A section of the mask layer 47 covers the cap layer 44 at the intended location of the etch mask for the emitter 48. An etching process is used, with the mask layer 47 present, to form the etch mask from the cap layer 44. The etch mask so formed is separated from the emitter layer 38 by the disposable material of the sacrificial layer 46. One or more etching processes are then used to trim layers 42, 46 and to trim the emitter layer 38 with conditions selected to stop on at top surface of the dielectric layer 34.

After the emitter layer 38 is trimmed, the remaining portion of the emitter layer 38 inside the emitter opening 36 comprises the emitter 48 of the bipolar junction transistor. The emitter 48 and, more specifically, a bottom surface of the emitter 48 opposite to top surface 40 is electrically and physically coupled with a top surface of the base layer 24. The top surface 40 and the recess bounded by top surface 40 are preserved when the emitter layer 38 is trimmed and top surface 40 and the recess bounded by top surface 40 are transferred to the emitter 48 to create a topology.

The mask layer 47 may be removed after the emitter 48 is formed. If comprised of a photoresist, the mask layer 47 may be removed by ashing or solvent stripping, followed by a cleaning process.

A device structure in the form of a bipolar junction transistor 80 features a vertical architecture in which the collector 20 in the device region 14, the base layer 24 (i.e., the section 26 of the base layer 24), and the emitter 48 are vertically arranged. The conductivity type of the semiconductor material constituting the base layer 24 is opposite to the conductivity type of the semiconductor materials constituting the emitter 48 and the collector 20, which defines emitter-base and base-collector junctions at their respective interfaces.

The bipolar junction transistor 80 may be characterized as a heterojunction bipolar transistor (HBT) if two or all three of the collector 20, the base layer 24, and the emitter 48 are comprised of different semiconductor materials with different bandgaps. For example, the intrinsic base formed from the section 26 of base layer 24 may be comprised of silicon-germanium and the collector 20 may be comprised of silicon without added germanium. As another example, the intrinsic base formed from the section 26 of base layer 24 may be comprised of silicon-germanium and the emitter 48 formed from the emitter layer 38 may be composed of silicon without added germanium. The bipolar junction transistor 80 may include multiple emitter fingers each structured like emitter 48 and constructed as described herein using the sacrificial layer 46 to cover top surface 40 when the emitter layer 38 is etched.

During the front-end-of-line (FEOL) portion of the fabrication process, the device structure of the bipolar junction transistor 80 is replicated across at least a portion of the surface area of each die of the substrate 10.

Figure 2:
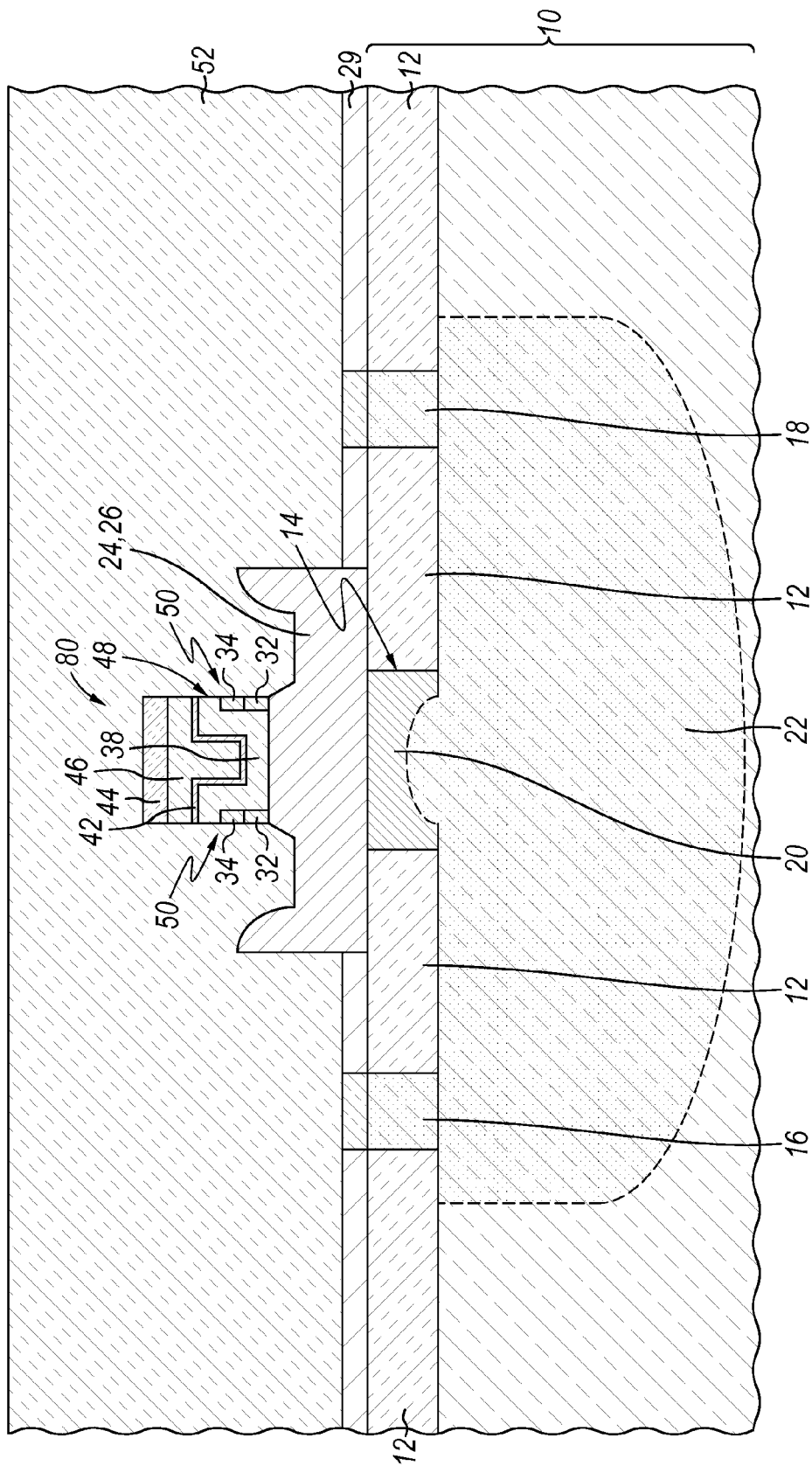

With reference to FIG. 2 in which like reference numerals refer to like features in FIG. 1 and at a subsequent fabrication stage, the dielectric layers 32, 34 and base layer 24 are patterned using photolithography and etching processes to remove field regions. To provide the patterning, another mask layer may be applied on a top surface of the dielectric layer 32 and patterned with photolithography. The mask layer may comprise a light-sensitive material, such as a photoresist, that is applied by a spin coating process, pre-baked, exposed to light projected through a photomask, baked after exposure, and developed with a chemical developer to form an etch mask. An etching process is used, with the mask layer present, to trim layers 24, 32, 34 and remove layer 30, while stopping on at top surface of the layer 29. The etching process may be conducted in a single etching step or multiple steps, and may rely on one or more etch chemistries. Composite non-conductive spacers 50 are defined from the dielectric materials of the dielectric layers 32, 34 adjacent to the emitter 48. The mask layer may be removed after the etching process is conducted. If comprised of a photoresist, the mask layer may be removed by ashing or solvent stripping, followed by a cleaning process.

A dielectric layer 52 is deposited and then planarized by, for example, chemical mechanical polishing to remove topography from underlying structures. The dielectric layer 52 may be comprised of borophosphosilicate glass (BPSG), silicon dioxide, fluorine-doped silicon glass (FSG), and combinations of these and other dielectric materials. The dielectric layer 52 may also contain multiple films, such as a thin contact etch stop or mobile ion barrier (e.g., silicon nitride) and a thick oxide layer (e.g., BPSG). If a silicon nitride layer is used, it would be relatively thin compared to the oxide level in dielectric layer 52 and could have thickness in the 25 nm to 100 nm range.

Figure 3:
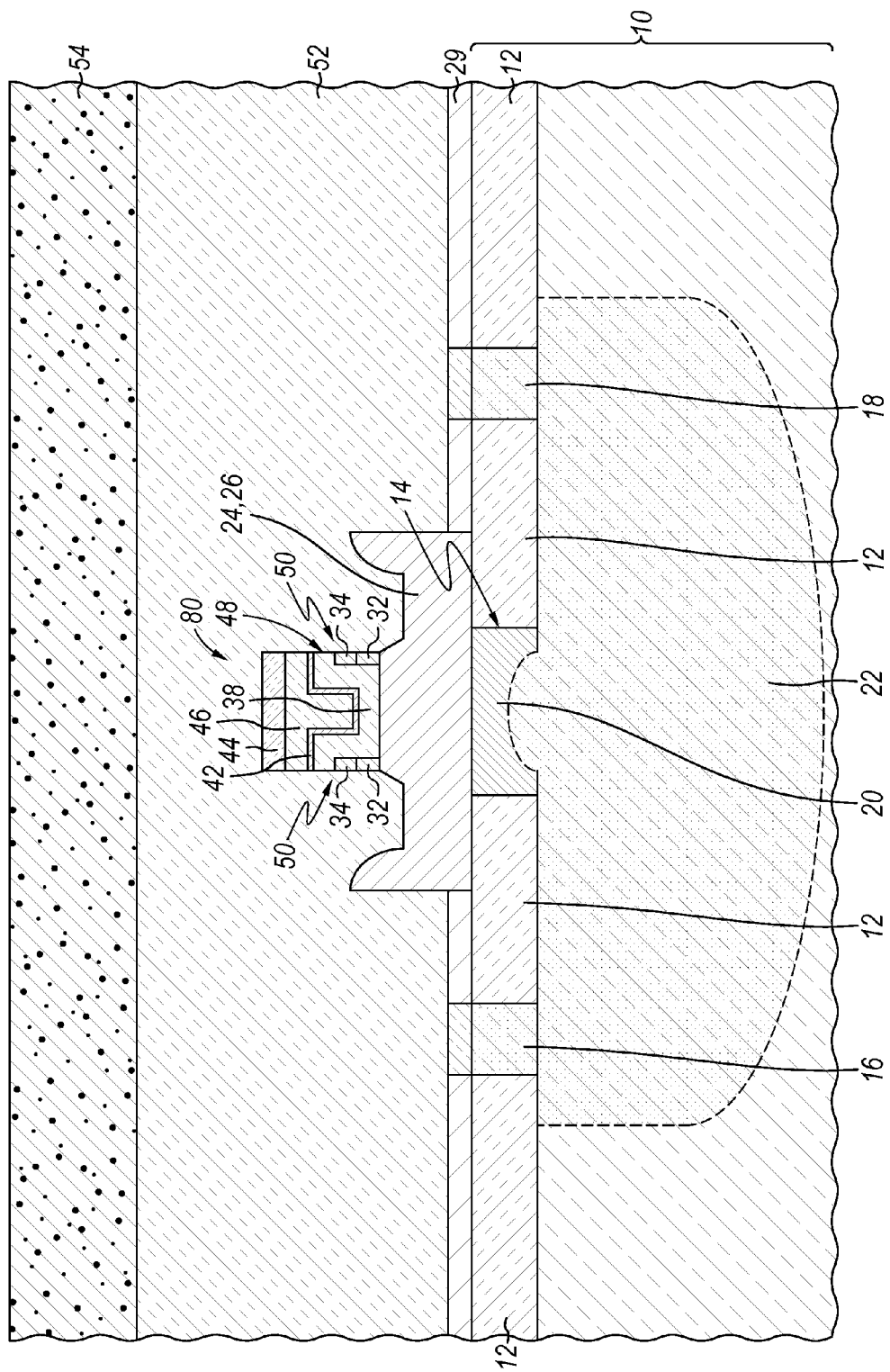

With reference to FIG. 3 in which like reference numerals refer to like features in FIG. 2 and at a subsequent fabrication stage, a mask layer 54 is applied on a top surface of the dielectric layer 52 and patterned with photolithography. The mask layer 54 may be comprised of a light-sensitive material, such as a photoresist, that is applied by a spin coating process, pre-baked, exposed to light projected through a photomask, and baked after exposure.

Figure 4:
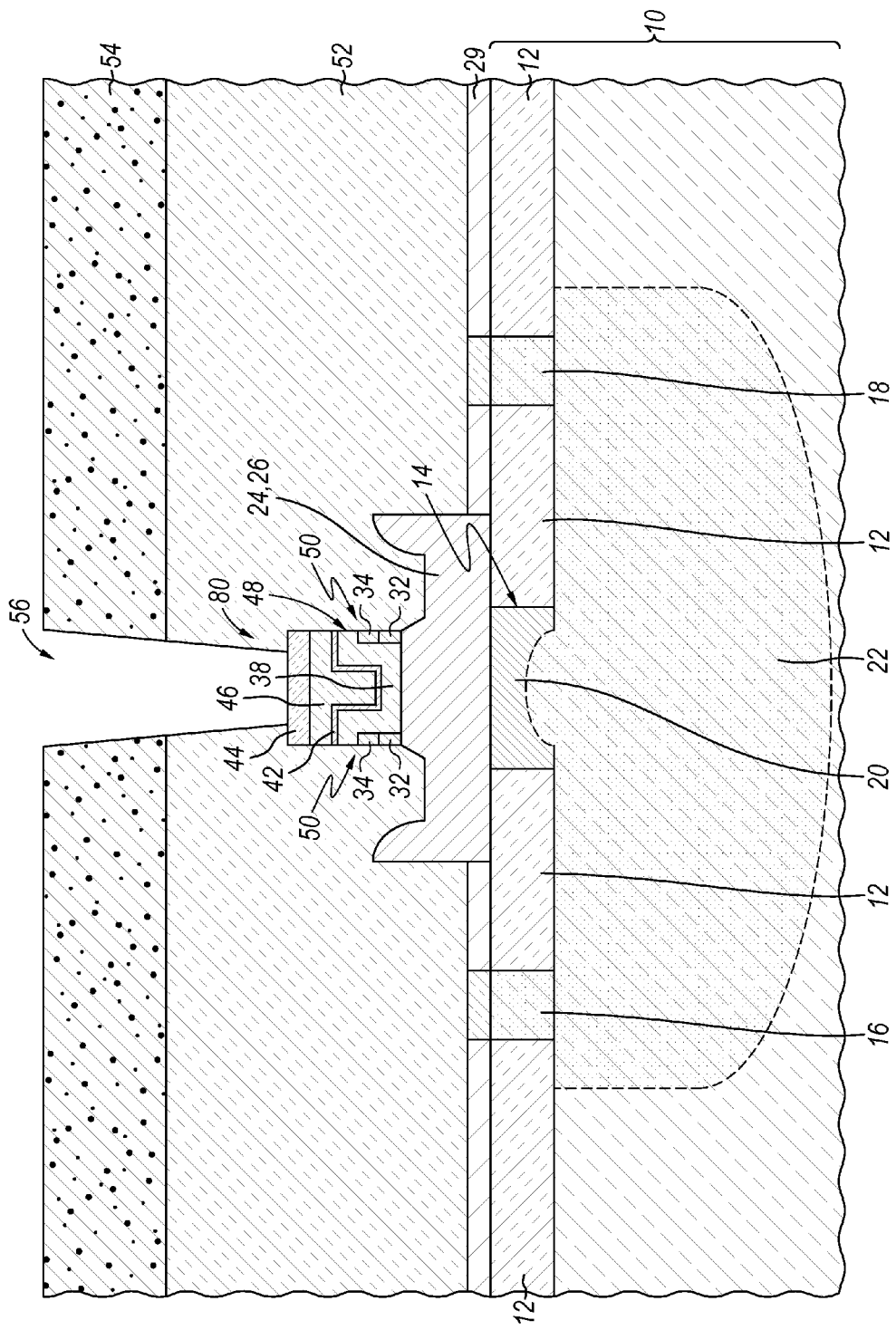

With reference to FIG. 4 in which like reference numerals refer to like features in FIG. 3 and at a subsequent fabrication stage, the mask layer 54 is developed with a chemical developer to define an opening 56 aligned with the emitter 48. An etching process is used, with the mask layer present, to extend the opening 56 into the dielectric layer 52 and to the top surface of the cap layer 44 so that the cap layer 44 is exposed. The etching process removes the material of the dielectric layer 52 selective to the material of the cap layer 44.

Figure 5:
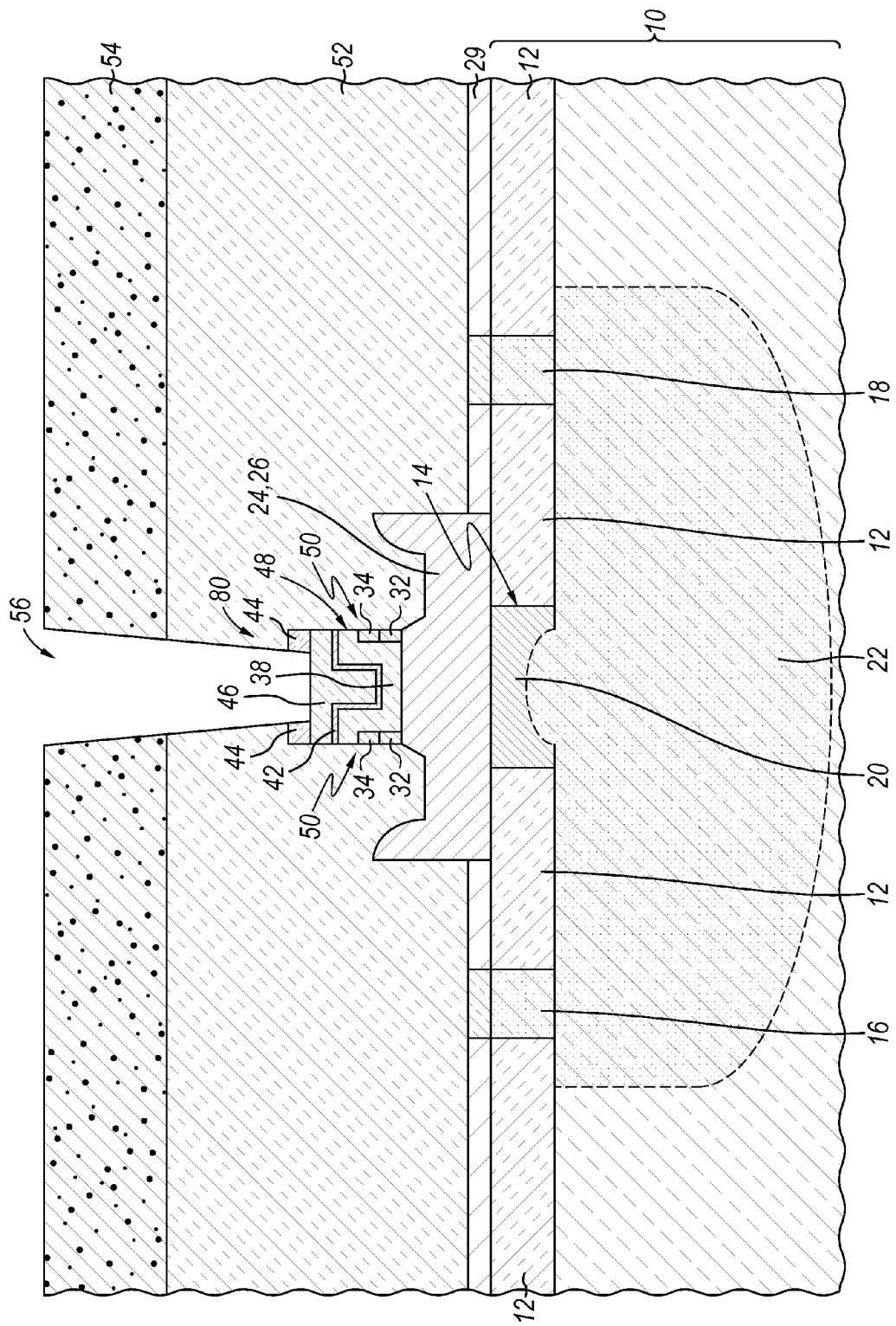

With reference to FIG. 5 in which like reference numerals refer to like features in FIG. 4 and at a subsequent fabrication stage, the etch mask comprised of the dielectric material of cap layer 44 is then removed from its position over the majority of the sacrificial layer 46 to provide access through the opening to the sacrificial layer 46. The cap layer 44 may be removed by an etching process that removes the material of the cap layer 44 from inside the opening 56 selective to the material of the sacrificial layer 46. The etching processes may rely on one or more etch chemistries suitable to provide the etch selectivity.

Figure 6:
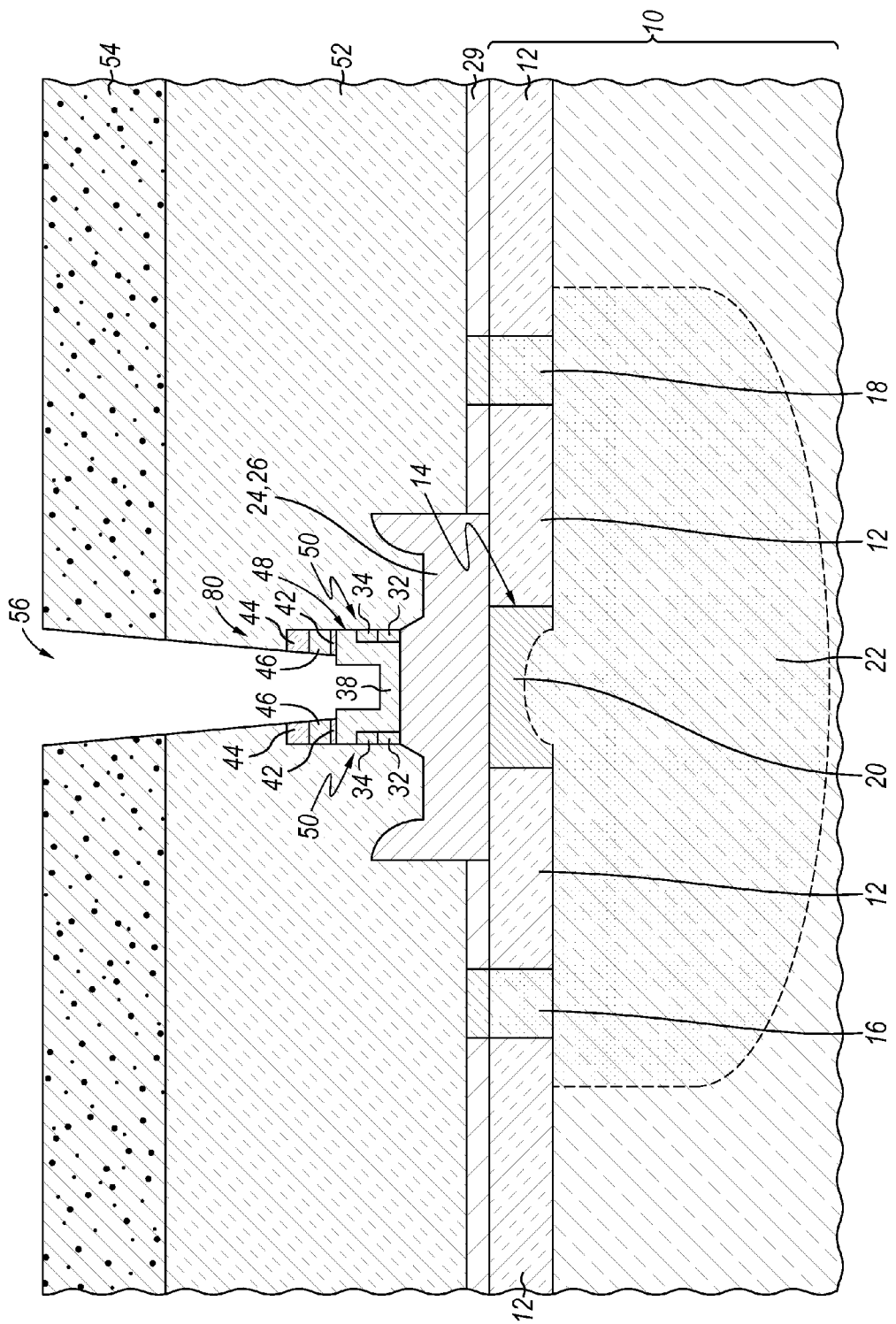

With reference to FIG. 6 in which like reference numerals refer to like features in FIG. 5 and at a subsequent fabrication stage, the sacrificial layer 46 is then removed within the opening 56 from the majority of top surface 40 and, therefore, from a position overlying the recess bounded by top surface 40 inside the emitter opening 36. The sacrificial layer may be removed selective to the dielectric layer 42 by an etching process. Dielectric layer 42 may function as an etch stop and protects the emitter 48 during the removal of the sacrificial layer 46. The thin dielectric layer 42 is then removed within the opening 56 by the same or a different etching process.

Because the recess bounded by the top surface 40 is occupied by the sacrificial layer 46 and is not occupied by the dielectric material of layer 44, the recess in the top surface 40 is free of dielectric material after the sacrificial layer 46 is removed and the recess bounded by a portion of top surface 40 is restored to an unfilled open space inside of the emitter opening 36. The presence of the sacrificial layer 46 and the optional thin dielectric layer 42 on the top surface 40 promotes the ability to clear or free the recess in the top surface 40 of dielectric material in preparation for forming an emitter contact that fully metallizes the top surface 40 of the emitter 48. The absence of dielectric material on top surface 40 may reduce (i.e., decrease) contact resistance because the full metallization and absence of dielectric material functions to increase and optimize the surface area over which the emitter contact is in direct contact with the emitter 48.

The use of the sacrificial layer 46 contrasts with conventional methods for forming an emitter in which a dielectric layer analogous to cap layer 44 functions as an etch mask for forming the emitter 48 from the emitter layer 38. In such conventional methods, the removal of the etch mask from the top surface 40 may be incomplete and dielectric material originating from the etch mask may remain on at least the vertical portions of the top surface 40 bounding the recess in top surface 40.

The mask layer 54 may be removed after the etching process is conducted. If comprised of a photoresist, the mask layer may be removed by ashing or solvent stripping, followed by a cleaning process. Alternatively, the mask layer 54 may be removed after the opening 56 is extended into the dielectric layer 52 and before the cap layer 44 and the disposable material of the sacrificial layer 46 are removed.

Figure 7:
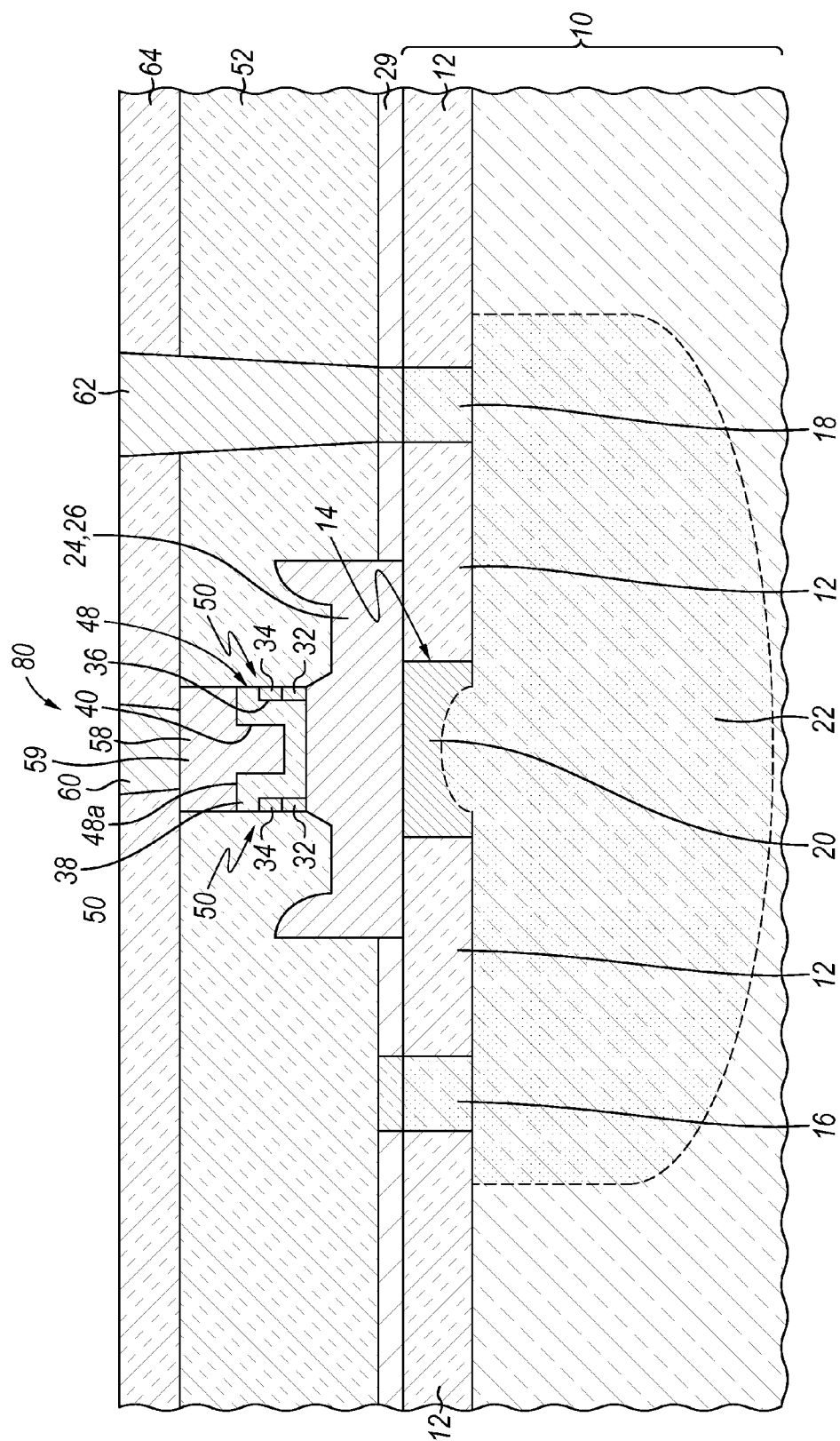

With reference to FIG. 7 in which like reference numerals refer to like features in FIG. 6 and at a subsequent fabrication stage, a contact 58 may be formed inside the opening 56 in the dielectric layer 52. A portion 59 of the contact 58 is received in the recess in the top surface 40 as a non-temporary replacement for the removed material of the sacrificial layer 46.

The contact 58 may be comprised of a metal, such as tungsten (W), that is deposited as a layer by, for example, physical vapor deposition and then planarized with, for example, chemical mechanical polishing to remove excess metal from the top surface of dielectric layer 52. The contact 58 represents a permanent structure in the bipolar junction transistor 80 that replaces the disposable material of the sacrificial layer 46. In an alternative embodiment, the material of the emitter 48 may be silicided before the contact 58 is formed. In another alternative embodiment, the material of the emitter 48 may be thinned to a layer thickness that is less than its original layer thickness by an etching process in order to enlarge the recess bounded by top surface 40 before the contact 58 is formed.

The contact 58, which may participate in forming part of a local interconnect structure on the chip, may have direct physical contact and direct electrical contact with the available top surface 40 of the emitter 48 exposed by removal of the sacrificial layer 46. Dielectric material from the cap layer 44 is not present between the emitter 48 and the contact 58 and, in particular, is not present on the vertical portions of the top surface 40. With decreasing device dimensions, the size reduction of the emitter opening 36 increases the challenge for making a contact. Because the top surface of the emitter 48 is fully metalized by the contact 58, the contact resistance and device performance may result in comparison with device structures formed by conventional processes in which the top surface of the emitter that is partially covered by dielectric material at the time of metallization and, as a consequence, is not fully metallized.

Middle-of-line (MOL) and back-end-of-the-line (BEOL) processing follows, which includes silicide formation, formation of contacts and wiring for the local interconnect structure to the bipolar junction transistor 80, and formation of dielectric layers, via plugs, and wiring for an interconnect structure coupled by the local interconnect wiring with the bipolar junction transistor 80. Other active and passive circuit elements, such as diodes, resistors, capacitors, varactors, and inductors, may be integrated into the interconnect structure and available for use in the integrated circuit.

Figure 7A:
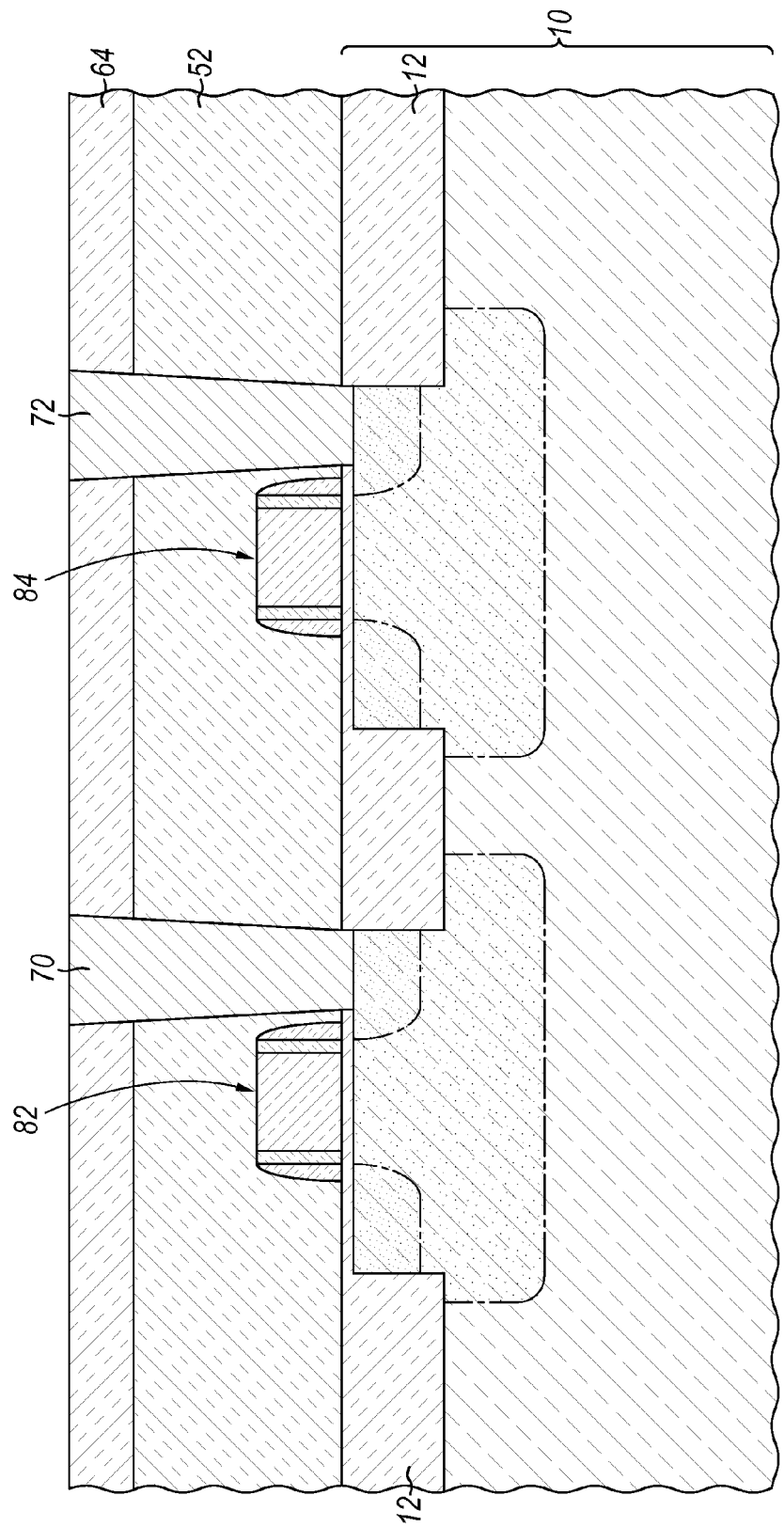
FIG. 7A is a cross-sectional view of a different portion of the substrate at a fabrication stage correlated with the fabrication stage of FIG. 7.

Additional device structures 82, 84 (FIG. 7A), such as complementary metal-oxide-semiconductor (CMOS) field-effect transistors, may be included in other circuitry fabricated during front-end-of-the-line processing using other portions of the substrate 10. As a result, both bipolar junction transistors 80 and field-effect transistors may be available on the same substrate 10 to fabricate a BiCMOS integrated circuit. The device structures 82, 84 may be fabricated before the bipolar junction transistors 80.

During middle-of-line processing, contacts 60, 62 may be formed in contact vias defined in a dielectric layer 64 as parts of the local interconnect structure and in accordance with an interconnect layout. One or more contacts 60 are aligned with the emitter 48 and contact 58, and one or more contacts 62 are aligned with at least one of the collector contact regions 16, 18. Each set of one or more contacts 60, 62 may comprise an array of vias (e.g., square vias) that are arranged with a given pitch or may comprise a bar via. The contacts 60, 62 are comprised of a conductor, such as a refractory metal like tungsten, and the contact vias can be clad with a titanium-based or tungsten-based liner. The contacts 60, 62 may be formed by depositing a layer of the metal by, for example, physical vapor deposition and then planarizing the metal layer with, for example, chemical mechanical polishing to remove excess metal from the top surface of dielectric layer 64. The dielectric layer 64 may be comprised of silicon dioxide, a different dielectric material, or a combination of dielectric materials.

As a consequence of the fabrication process, the local interconnect structure may include a plurality of separate contacts 58, 60 in a tiered or vertical stack that are coupled with the emitter 48. These separate contacts 58, 60 are each formed by a distinct and separate damascene process with contact 58 being formed before contact 60. In an embodiment, the width of contact 58 may be 250 nm and the width of contact 60 may be 100 nm. The utilization of multiple contacts 58, 60 avoids the necessity for a single deep finger to provide emitter contact and, in particular, eliminates an imprecise dielectric etching process needed to provide a single contact via. If the etching process fails to completely remove the dielectric, then a high contact resistance may result. If the etching process is excessive, then the contact via may potentially penetrate through the emitter layer 38.

The local interconnect structure may include additional contacts 70, 72 that are coupled with the device structures 82, 84 (e.g., coupled with the source/drain regions of field-effect transistors) and that are concurrently formed with the contacts 58, 60.

Figure 8:
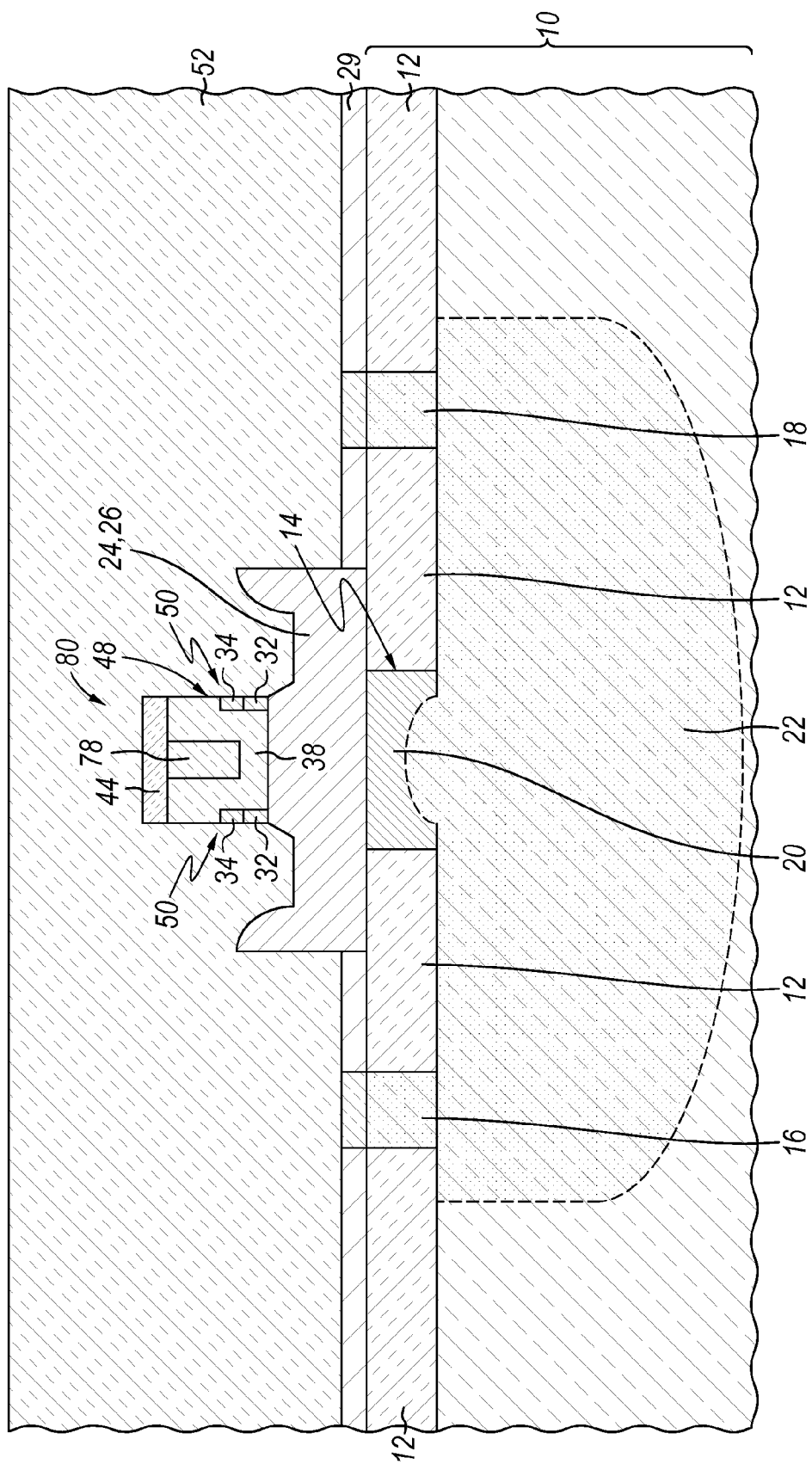
FIGS. 8-12 are cross-sectional views of a portion of a substrate at successive fabrication stages of a processing method for fabricating a device structure in accordance with alternative embodiments of the invention.

With reference to FIG. 8 in which like reference numerals refer to like features in FIG. 2 and at a subsequent fabrication stage, the dielectric layer 42 may be omitted, and the sacrificial layer 46 may be replaced by a layer 78. The layer 78 is covered by cap layer 44, which is partially removed when the opening 56 is formed. The layer 78 may be similar to sacrificial layer 46 in composition and comprised of a disposable material that etches selective to the material of the emitter layer 38. For example, the layer 78 may be comprised of germanium, silicon-germanium, or silicon dioxide if the emitter layer 38 is comprised of silicon.

Alternatively, the layer 78 may be comprised of a different type of material that is not disposable or sacrificial, and that persists in the final device structure. For example, such a non-disposable layer may be comprised of tungsten (W), titanium nitride (TiN), tungsten silicide ($WSi_2$), or a combination thereof.

Figure 9:
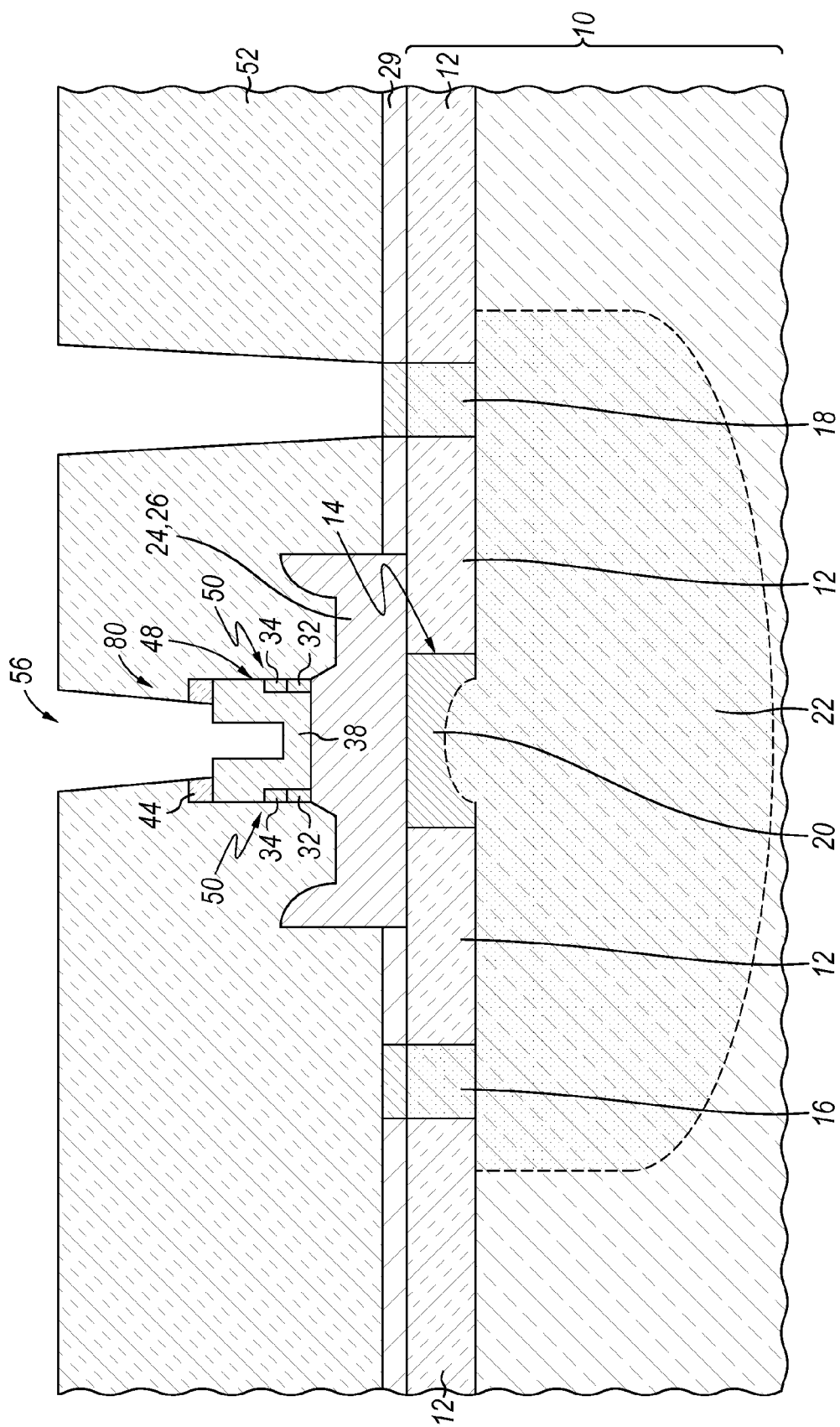

With reference to FIG. 9 in which like reference numerals refer to like features in FIG. 8 and at a subsequent fabrication stage, the fabrication process may proceed through the fabrication stages of FIGS. 3-6 with the layer 78 being removed with access for removal through the opening 56 after the access opening 56 is extended through the cap layer 44. In this embodiment, the layer 78 is comprised of a disposable material.

Figure 10:
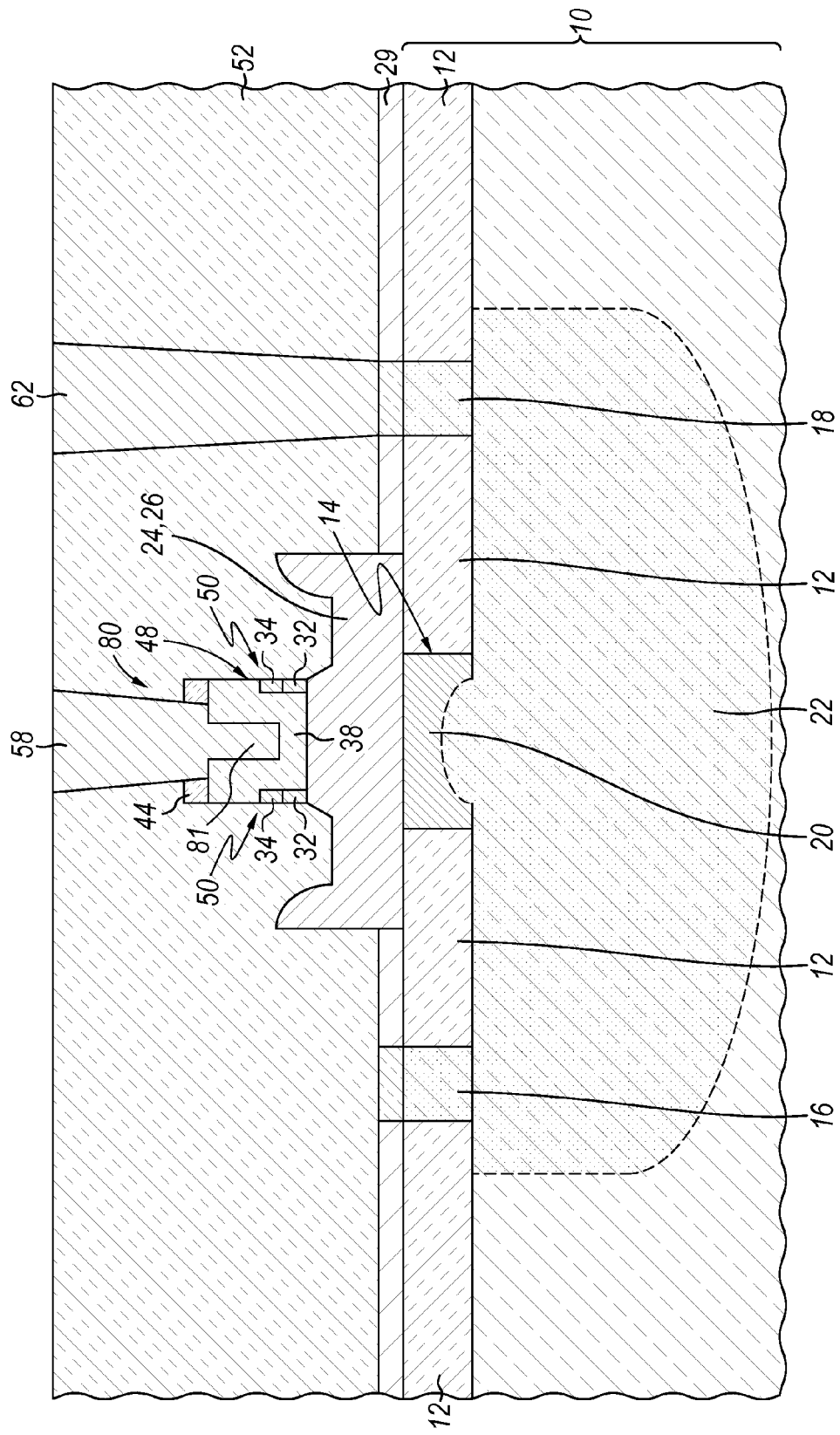

With reference to FIG. 10 in which like reference numerals refer to like features in FIG. 9 and at a subsequent fabrication stage, the contact 58 may then be formed inside the opening 56 in the dielectric layer 52. The contact 58 represents a permanent structure in the bipolar junction transistor 80 that replaces the disposable material of the layer 78. The contact 58 may have direct physical contact and direct electrical contact with the available top surface 40 of the emitter 48 exposed when the layer 78 is removed. A portion 81 of the contact 58 is received in the recess in the top surface 40 as a non-temporary replacement for the removed material of the layer 78.

Dielectric material from the cap layer 44 is not present between the emitter 48 and the contact 58 and, in particular, is not present on the vertical portions of the top surface 40. Because the top surface of the emitter 48 is fully metalized by the contact 58, the contact resistance and device performance may result in comparison with device structures formed by conventional processes in which the top surface of the emitter that is partially covered by dielectric material at the time of metallization and, as a consequence, is not fully metallized.

Figure 11:
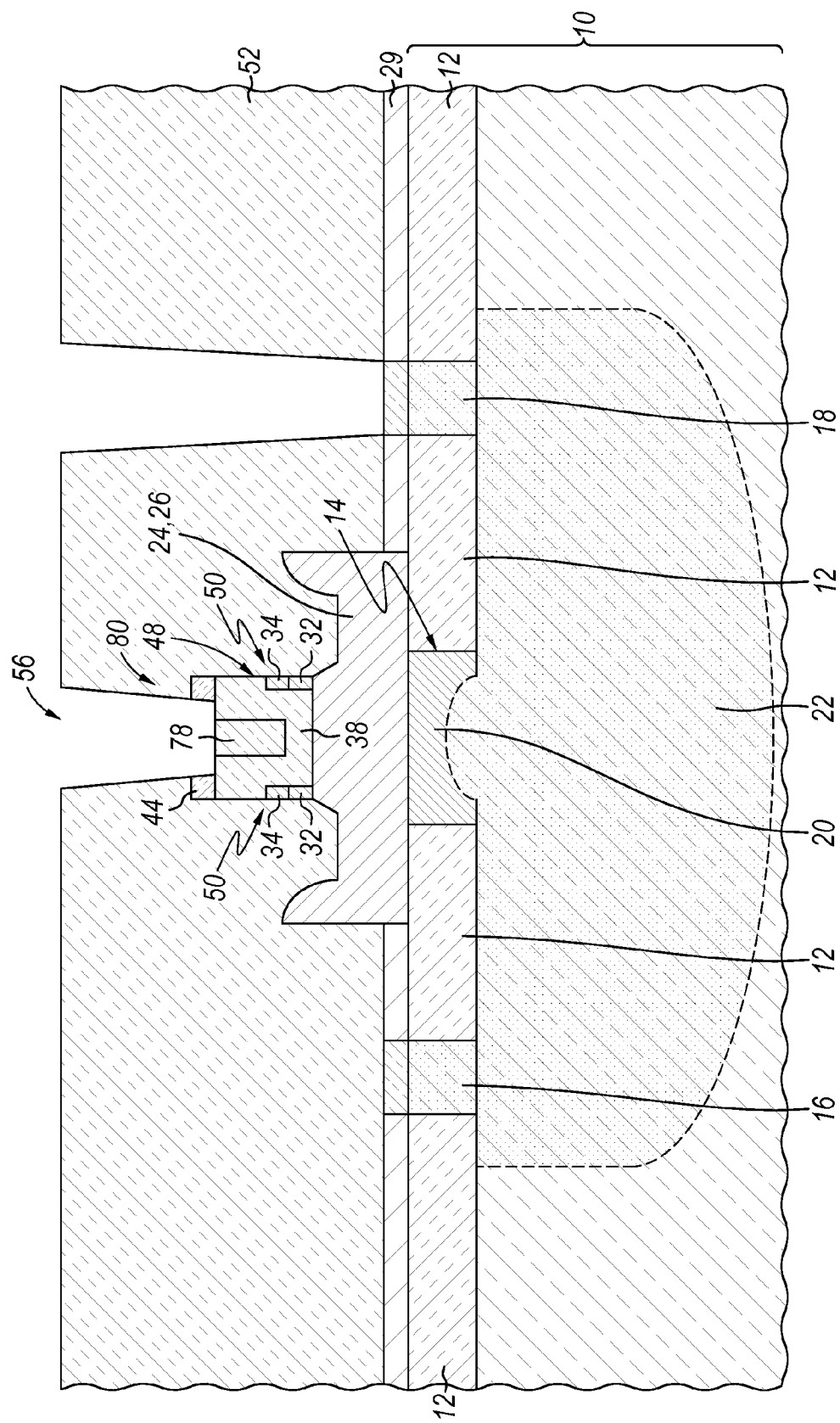

With reference to FIG. 11 in which like reference numerals refer to like features in FIG. 9 and at a subsequent fabrication stage in accordance with an alternative embodiment, the fabrication process may proceed through the fabrication stages of FIGS. 3-5 with the layer 78 remaining as a permanent structure in the final device structure. In this embodiment, the layer 78 is not comprised of a disposable material, and the layer 78 is not removed by selective etching relative to the emitter layer 38 after the access opening 56 is extended through the cap layer 44.

Figure 12:
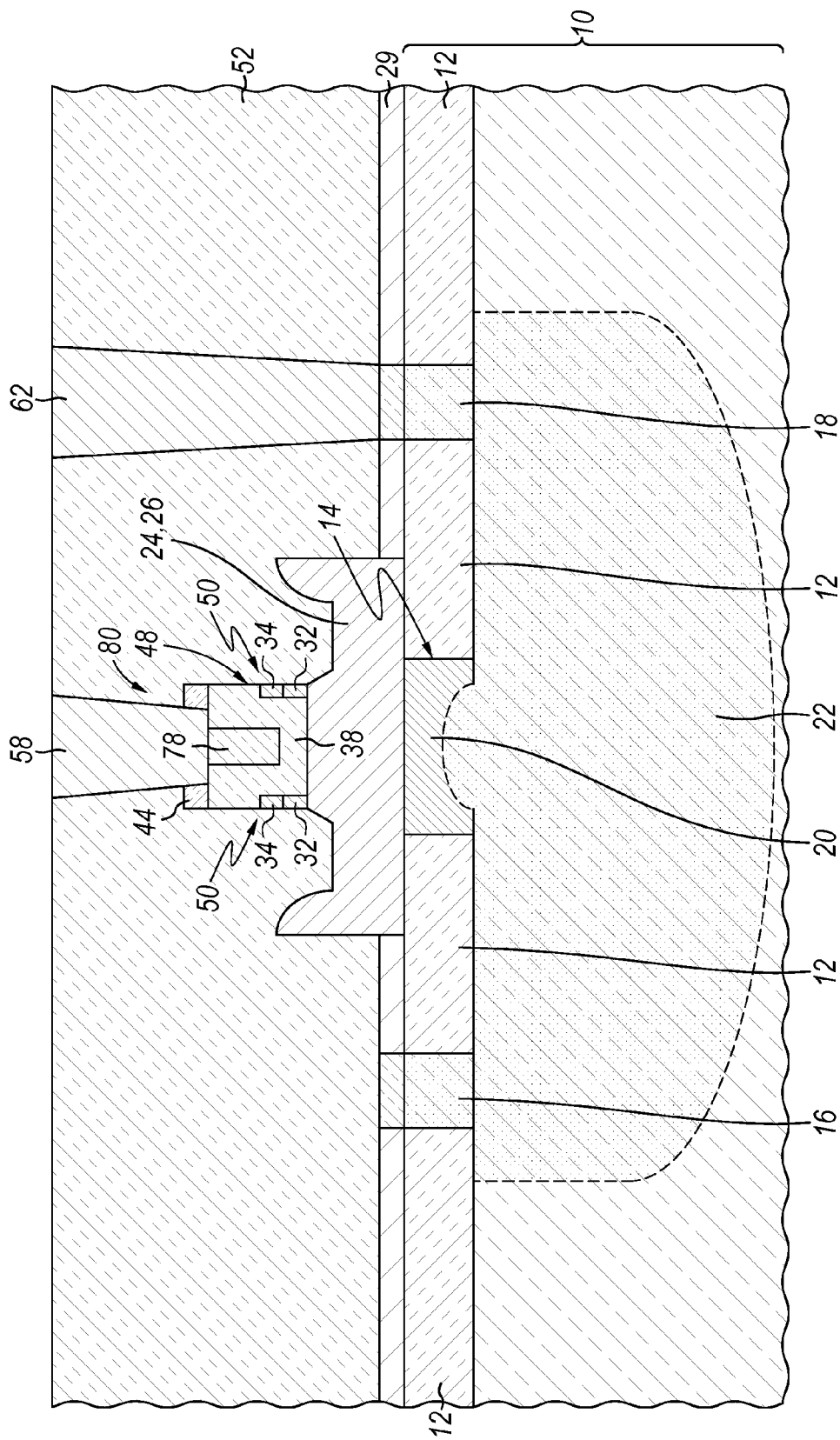

With reference to FIG. 12 in which like reference numerals refer to like features in FIG. 11 and at a subsequent fabrication stage, the contact 58 may then be formed inside the opening 56 in the dielectric layer 52, and contacts the conductor in the recess. The contact 58 represents a permanent structure in the bipolar junction transistor 80 that replaces the disposable material of the layer 78. The contact 58 may have direct physical contact and direct electrical contact with the available top surface 40 of the emitter 48 exposed when the layer 78 is removed. Dielectric material from the cap layer 44 is not present between the emitter 48 and the contact 58 and, in particular, is not present on the vertical portions of the top surface 40. Because the top surface of the emitter 48 is fully metalized by the contact 58, the contact resistance and device performance may result in comparison with device structures formed by conventional processes in which the top surface of the emitter that is partially covered by dielectric material at the time of metallization and, as a consequence, is not fully metallized.

The methods as described above may be used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a device structure, the method comprising:
    forming an emitter structure having a semiconductor layer with a top surface defining a recess and a sacrificial layer comprised of a disposable material in the recess;
    forming a first contact opening extending through one or more first dielectric layers to the sacrificial layer; and
    after the first contact opening is formed, removing the sacrificial layer from the recess.

2. The method of claim 1 further comprising:
    forming a contact in the first contact opening to replace the sacrificial layer and to contact the semiconductor layer,
    wherein a portion of the first contact is received in the recess.

3. The method of claim 1 wherein the sacrificial layer is removed from the recess by etching with access to the sacrificial layer provided through the first contact opening.

4. The method of claim 3 wherein the disposable material of the sacrificial layer is selected to etch selectively relative to a semiconductor material of the semiconductor layer.

5. The method of claim 4 wherein the semiconductor layer is comprised of polysilicon, and the disposable material of the sacrificial layer is configured to etch selective to the polysilicon.

6. The method of claim 3 further comprising:
    forming an etch stop layer in the recess and on the semiconductor layer; and
    forming the sacrificial layer on the etch stop layer.

7. The method of claim 3 further comprising:
after the sacrificial layer is removed from the recess, forming a first contact in the first contact opening to replace the sacrificial layer and to contact the semiconductor layer.

8. The method of claim 7 further comprising:
depositing a second dielectric layer on the one or more first dielectric layers;
forming a second contact opening in the second dielectric layer; and
forming a second contact in the second contact opening, wherein the second contact opening is aligned with the first contact opening, and the second contact is coupled with the first contact.

9. The method of claim 1 further comprising:
forming a cap layer of the emitter structure on a planar top surface of the sacrificial layer,
wherein the cap layer functions as an etch stop layer when the first contact opening is formed.

10. The method of claim 1 wherein the disposable material is comprised of silicon dioxide, silicon, or silicon-germanium.

11. The method of claim 1 wherein forming the emitter structure comprises:
forming the semiconductor layer in an emitter opening defined in one or more second dielectric layers,
wherein the first contact opening is aligned with the emitter opening.

12. A method for fabricating a device structure, the method comprising:
forming an emitter structure having a semiconductor layer with a top surface defining a recess and a conductor layer in the recess;
forming a first contact opening extending through one or more first dielectric layers to the semiconductor layer and the conductor layer; and
after the first contact opening is formed, forming a contact in the first contact opening to contact the semiconductor layer and the conductor layer.

13. The method of claim 12 wherein the emitter structure is formed in an emitter opening in one or more second dielectric layers, and further comprising:
forming a cap layer of the emitter structure on a planar top surface of the conductor layer,
wherein the cap layer functions as an etch stop layer when the first contact opening is formed,
wherein the first contact opening is aligned with the emitter opening.

14. The method of claim 12 wherein forming the emitter structure comprises:
forming the semiconductor layer in an emitter opening defined in one or more second dielectric layers.

15. The method of claim 12 further comprising:
depositing a second dielectric layer on the one or more first dielectric layers;
forming a second contact opening in the second dielectric layer; and
forming a second contact in the second contact opening, wherein the second contact opening is aligned with the first contact opening, and the second contact is coupled with the first contact.

16. The method of claim 15 wherein the device structure includes a collector contact region, and further comprising:
forming a third contact opening in the second dielectric layer; and
forming a third contact in the third contact opening, wherein the third contact opening is aligned with the collector contact region and is formed when the second contact opening is formed.

* * * * *